US007990789B2

(12) United States Patent
Nakazawa et al.

(10) Patent No.: US 7,990,789 B2
(45) Date of Patent: Aug. 2, 2011

(54) SEMICONDUCTOR MEMORY DEVICE AND CONTROL METHOD

(75) Inventors: Shigeyuki Nakazawa, Tokyo (JP); Toru Ishikawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 359 days.

(21) Appl. No.: 12/320,585

(22) Filed: Jan. 29, 2009

(65) Prior Publication Data

US 2009/0190411 A1    Jul. 30, 2009

(30) Foreign Application Priority Data

Jan. 30, 2008   (JP) ............................... P2008-018946
Oct. 3, 2008    (JP) ............................... P2008-258676

(51) Int. Cl.
*G11C 7/00*   (2006.01)

(52) U.S. Cl. ...................... 365/201; 365/63; 365/189.07; 365/189.14

(58) Field of Classification Search ................... 365/201, 365/63, 189.07, 189.14, 189.19, 230.03

See application file for complete search history.

(56) References Cited

U.S. PATENT DOCUMENTS

| 6,400,623 B2 * | 6/2002 | Ohno ............................ 365/201 |
| 6,438,760 B1 * | 8/2002 | Wakefield et al. ............ 2/209.13 |
| 2006/0123291 A1 * | 6/2006 | Kim ............................. 714/724 |

FOREIGN PATENT DOCUMENTS

JP    2000-40397 A    2/2000

* cited by examiner

*Primary Examiner* — Son T Dinh
(74) *Attorney, Agent, or Firm* — McGinn IP Law Group, PLLC

(57) ABSTRACT

A semiconductor memory device, in which a plurality of data output lines are commonly used by a plurality of banks, includes a plurality of gate circuits each of which are provided at each intermediate position of the plurality of the data output lines, and is controlled to be turned on during a normal operation mode and to be turned off at least when reading data during a parallel test mode, and a comparator circuit that inputs in parallel and compares a signal of each separated part of the each data output line separated by the plurality of the gate circuit being turned off.

10 Claims, 17 Drawing Sheets

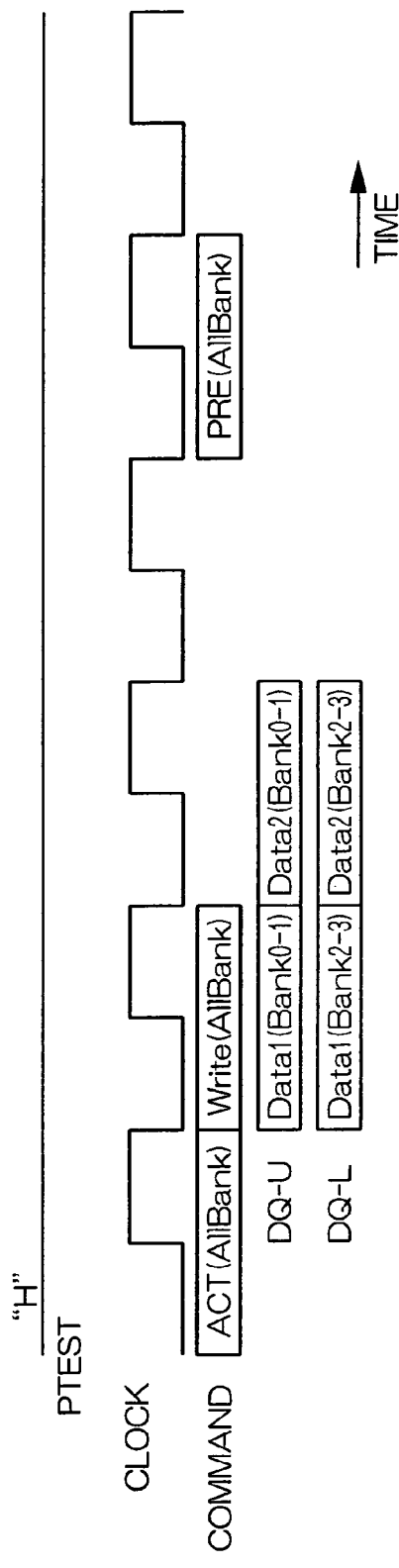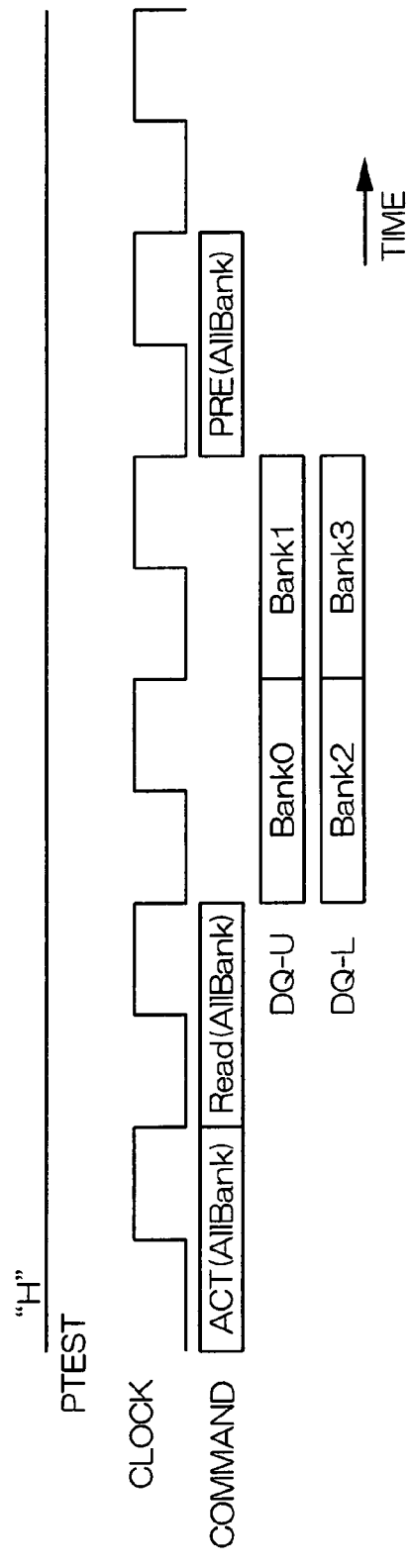

SEMICONDUCTOR MEMORY DEVICE AND CONTROL METHOD

Priority is claimed on Japanese Patent Applications No. 2008-018946, filed Jan. 30, 2008, and No. 2008-258676, filed Oct. 3, 2008, the contents of which are incorporated herein by reference.

BACKGROUND OF THE INVENTION

1. Field of the Invention

The present invention relates to a semiconductor memory device and its control method that are preferable to be used when an input and output line (IO line) and the like, which output data and the like, are commonly used between banks.

2. Description of Related Art

In a dynamic random access memory (DRAM) having a plurality of banks, there are some cases in that a main input and output line (hereinbelow referred to as a MIO line), which inputs and outputs data from a memory cell to a peripheral circuit, is provided to each bank. The bank includes an address decoder, the memory cell array, a sense amplifier, and the like, and corresponds to a unit that is independently controlled in response to a command input from the external thereof. In addition, a plurality of local input and output lines (hereinbelow referred to as LIO lines), which inputs and outputs data to each memory cell via the sense amplifier and a bit line, connects with the MIO line.

In DRAM having a lot of MIO lines, if each bank is provided with the MIO line, the total number of the IO lines in a chip considerably increases, and the circuit line highly affects chip layout and space in DRAM that has a small storage capacity. In order to reduce the number of the MIO lines, the MIO line, which is provided with each bank, is commonly used between the banks. In this manner, a control of a bank unit is applied to a transistor and the like, which output data to the MIO line, and hence, a reduction in the number of the MIO lines is attempted.

On the other hand, in order to reduce testing cost, there are a lot of cases in that DRAM includes a circuit which achieves a parallel test (for example, refer to Japanese Unexamined Patent Application, First Publication, No. 2000-40397). In the parallel test, a lot of data are simultaneously written to a plurality of the memory cells from the limited MIO line, and then, the data is simultaneously read and compared with each other. Thereby, it can be simultaneously determined that a plurality of the memory cells correctly operates when the data is compared and agrees with each other. It can be said that the parallel test is an indispensable technology to DRAM at present.

There are a lot of technologies in which a parallel number of the parallel test is increased by simultaneously activating a plurality or all of the banks. However, in the above-mentioned circuit in which the same MIO line is commonly used by a plurality of the banks, the same MIO line is connected with a plurality of the banks. For this reason, a conflict of data output from each bank takes place in the same MIO line commonly used by a plurality of the banks, when a plurality of the banks are simultaneously activated so as to input and output data in the parallel test. Therefore, a control method is necessary to avoid the conflict of data in the parallel test of the chip in which the same MIO line is commonly used by a plurality of the banks. That is, for example, as shown in FIG. 7 to FIG. 9, each bank has to be operated in serial at a stage, in which data is output to an external data input and output line DQ after all the banks are simultaneously activated so as to input the data. When this serial operation is employed, testing time increases rather than the case operating in parallel entirely, so that the testing cost increases.

FIG. 7 and FIG. 8 show a typical example of a semiconductor memory device that includes 4 banks. More particularly, FIG. 7 shows a connecting condition of a normal operation mode, while FIG. 8 shows a connecting condition of a parallel test mode. FIG. 9 shows a timing chart of a read operation in the parallel test mode.

As shown in FIG. 7 and FIG. 8, 4 pieces of banks, or a bank 0 to a bank 3, which include a memory cell array and the like, are commonly provided with the 4 MIO lines. Each of the bank 0 to the bank 3 is provided with a bank array which includes a plurality of the LIO lines (unillustrated) connecting with each MIO line via transistors Tr 0 to Tr 3 and the like, a sense amplifier, a bit line, the memory cell, and the like.

The 2 MIO lines connect with a peripheral circuit 11 placed at a bank 0 side, and the other 2 MIO lines connect with a peripheral circuit 12 placed at a bank 3 side during the normal operation mode, as shown in FIG. 7. The peripheral circuits 11 and 12 include a main amplifier, a data latch circuit, and the like. The data is input and output to the memory cell in each of the bank 0 to the bank 3 via the peripheral circuit 11 or the peripheral circuit 12, by using the external data input and output line DQ (unillustrated).

On the other hand, all of the 4 MIO lines connect with a comparator circuit 21 during the parallel test mode, as shown in FIG. 8. After data is written in the banks for the test, the data is sequentially read out from each bank at a timing shown in FIG. 9. The data read to a plurality of the MIO lines is compared by the comparator circuit 21 for every adjacent memory mat. The compared result is output to the external data input and output line DQ in the serial operation. A clock signal, a command input from the outside, a variation of the data of the external data input and output line DQ are shown, from the top to the bottom in order, in FIG. 9. When a bank active command for all banks "ACT (All Bank)" followed by a read command for all the banks "Read (All Bank)" is input, the compared result of each of the bank 0 to the bank 3 is sequentially output to the external data input and output line DQ. After that, a precharge command for all the banks "PRE (All Bank)" is input, all the banks are precharged, and then, each bank is in an idle state.

As described above, when the parallel test, in which a signal of a plurality of data input and output lines is compared, is carried out, it is necessary to sequentially read the data from each bank in the serial operation in the semiconductor memory device in which a data input and output line, such as the MIO line or the like for at least outputting the data, is commonly used by a plurality of the banks. For this reason, the testing time increases due to the serial operation, and hence, there is a problem in that the testing cost increases.

SUMMARY

The present invention seeks to solve one or more of the above problems, or to improve those problems at least in part.

A semiconductor memory device, in which a plurality of data output lines are commonly used by a plurality of banks, includes a plurality of first gate circuits each of which is provided at each intermediate position of the plurality of the data output lines, and is controlled to be turned on during a normal operation mode and to be turned off at least when reading data during a parallel test mode.

A control method of a semiconductor memory device, in which a plurality of data output lines are commonly used by a plurality of banks includes controlling a plurality of gate circuits, each of which is provided at each intermediate position of the plurality of the data output lines, to be turned on during a normal operation mode; and controlling the plurality of the gate circuits to be turned off at least when reading data during a parallel test mode.

BRIEF DESCRIPTION OF THE DRAWINGS

The above features and advantages of the present invention will be more apparent from the following description of certain preferred embodiments taken in conjunction with the accompanying drawings, in which:

FIG. 12A is a timing chart that explains a data write operation of the parallel test mode in the configuration shown in FIG. 11, according to the first embodiment of the present invention;

FIG. 12B is a timing chart that explains a data read operation of the parallel test mode in the configuration shown in FIG. 11, according to the first embodiment of the present invention;

DETAILED DESCRIPTION OF PREFERRED EMBODIMENTS

The invention will be described herein with reference to illustrative embodiments. Those skilled in the art will recognize that many alternative embodiments can be accomplished using the teachings of the present invention and that the invention is not limited to the embodiments illustrated herein for explanatory purposes.

Embodiments of the present invention will be described hereinbelow with reference to the drawings.

First Embodiment

Figure 1:
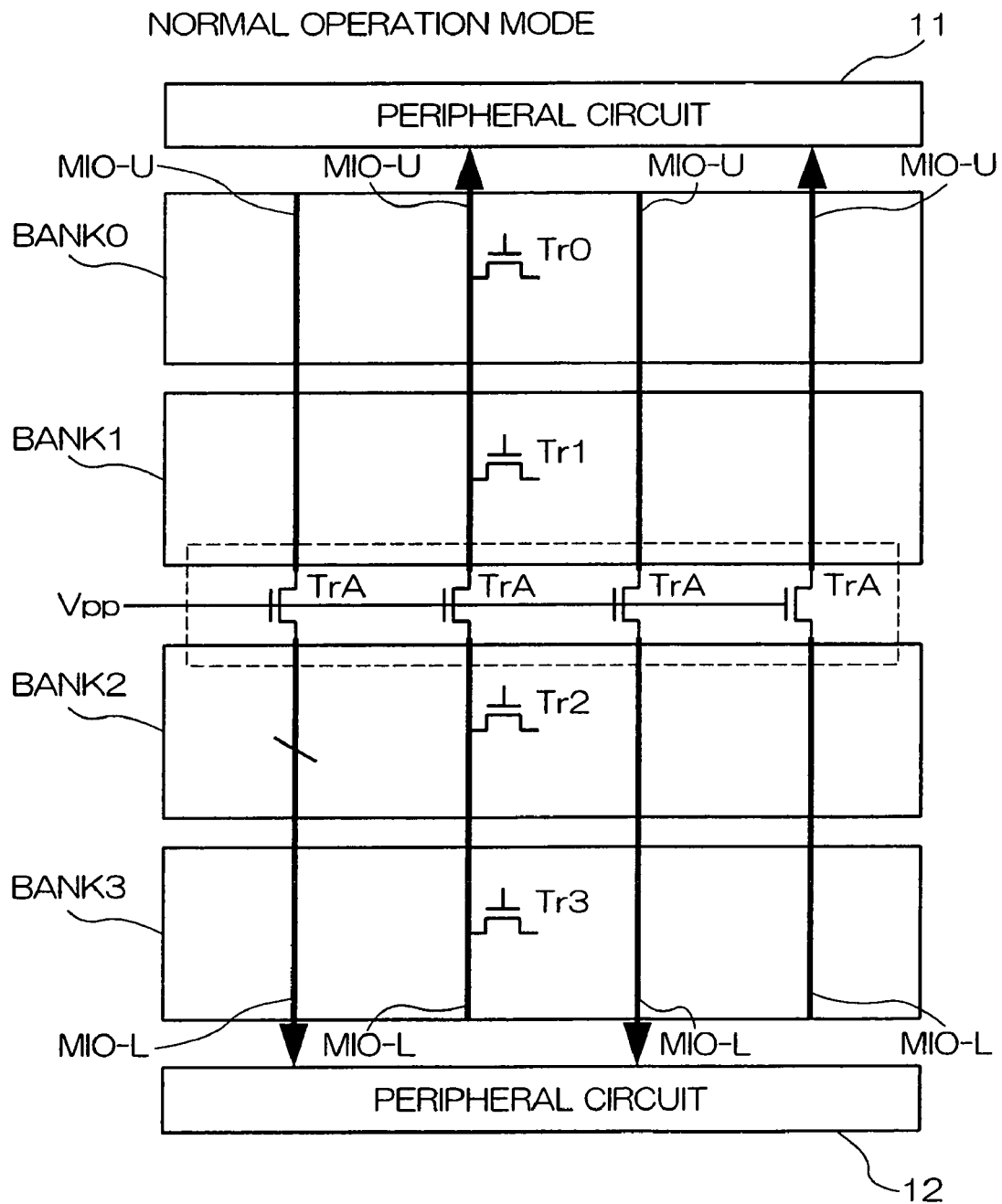
FIG. 1 is a block diagram that shows a connecting configuration of a semiconductor memory device during a normal operation mode, according to a first embodiment of the present invention.
Figure 2:
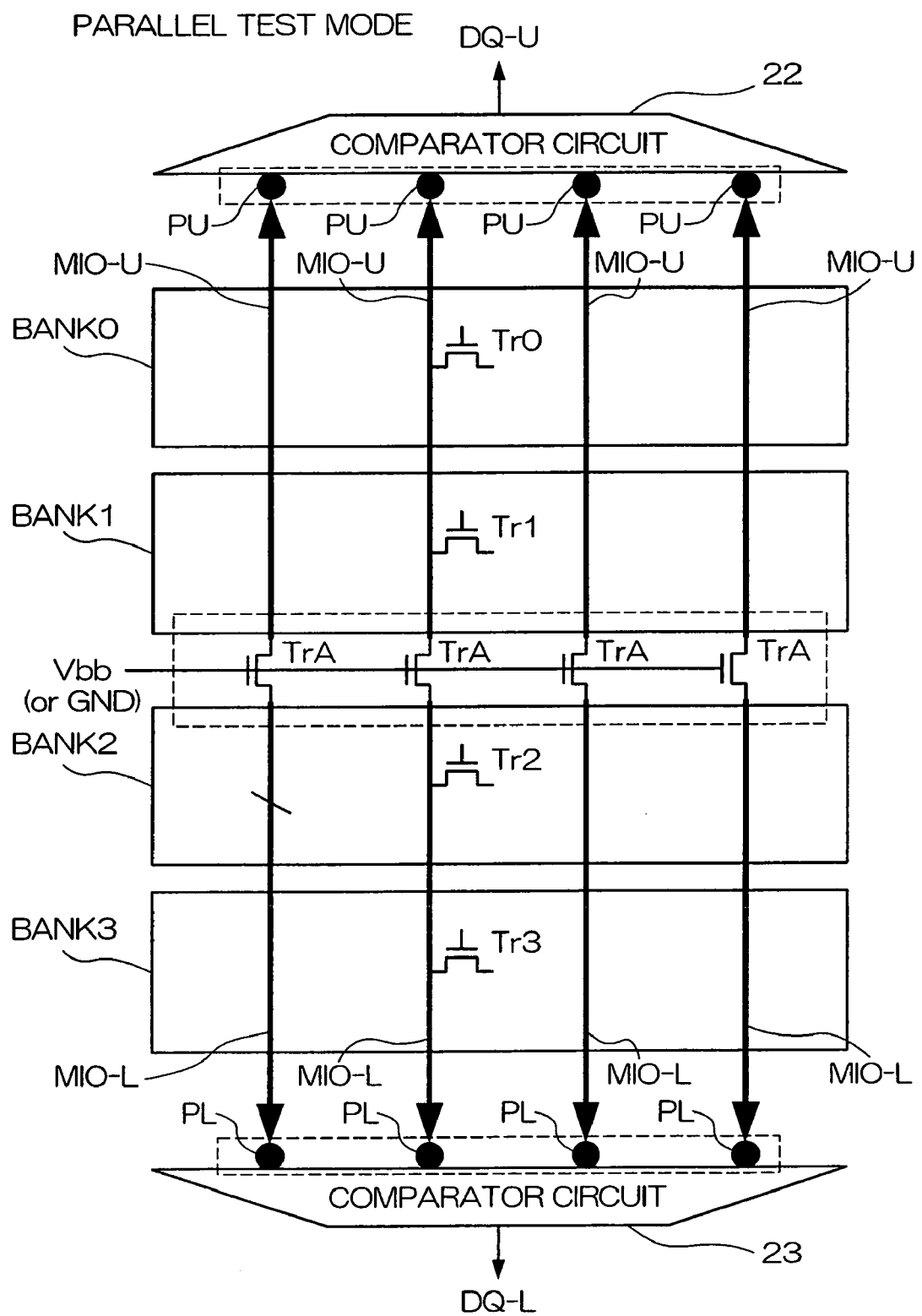
FIG. 2 is a block diagram that shows the connecting configuration of the semiconductor memory device shown in FIG. 1 during a parallel test mode, according to the first embodiment of the present invention.
Figure 3:
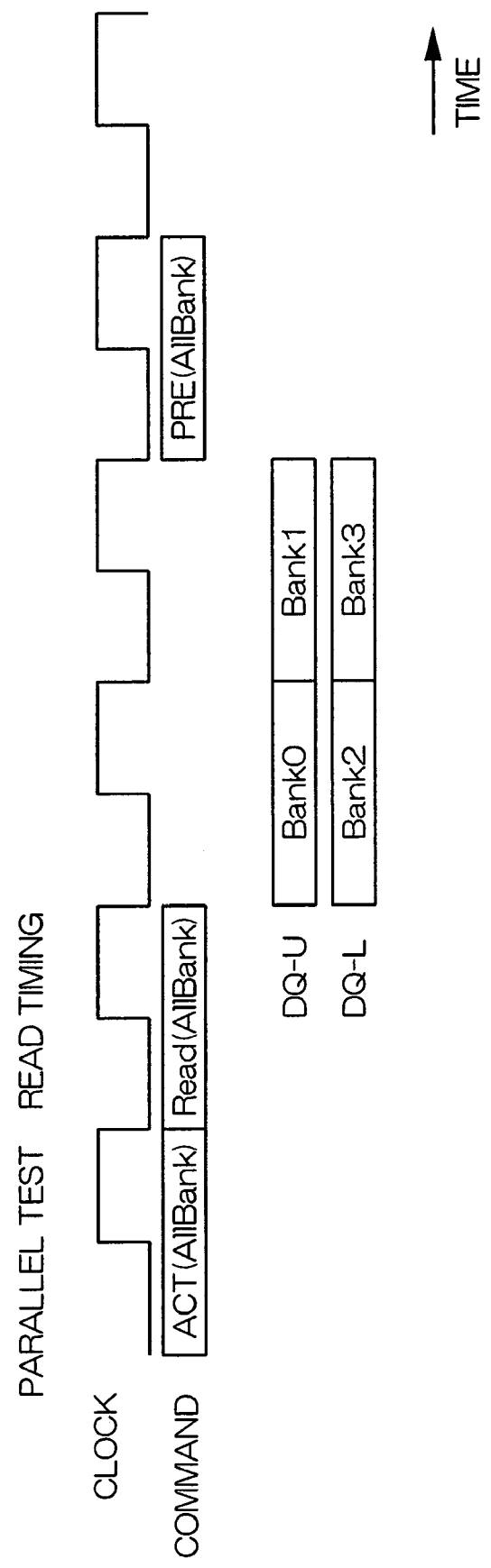
FIG. 3 is a timing chart that explains an operation of the parallel test mode in the configuration shown in FIG. 2, according to the first embodiment of the present invention.

A first embodiment of the present invention will be described hereinbelow with reference to FIG. 1 to FIG. 3. A configuration of the first embodiment includes 4 banks. FIG. 1 shows a connecting condition of a normal operation mode. FIG. 2 shows a connecting condition of a parallel test mode. The same reference code is provided to the same configuration shown in FIG. 1 as that shown in FIG. 7.

Figure 7:
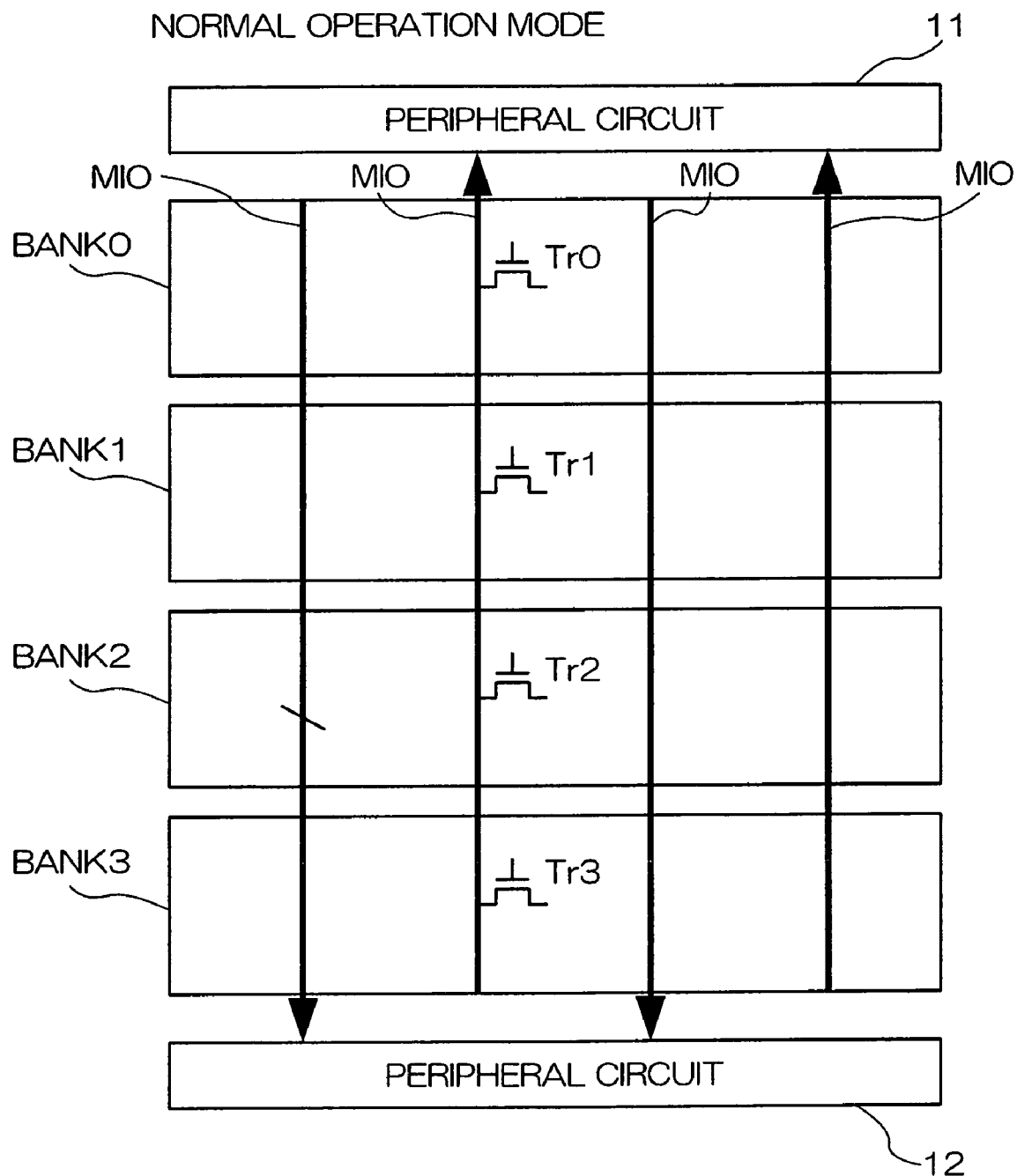
FIG. 7 is a block diagram that shows an example of the connecting configuration of the semiconductor memory device during the normal operation mode, for explaining a problem to be solved by the present invention.
Figure 8:
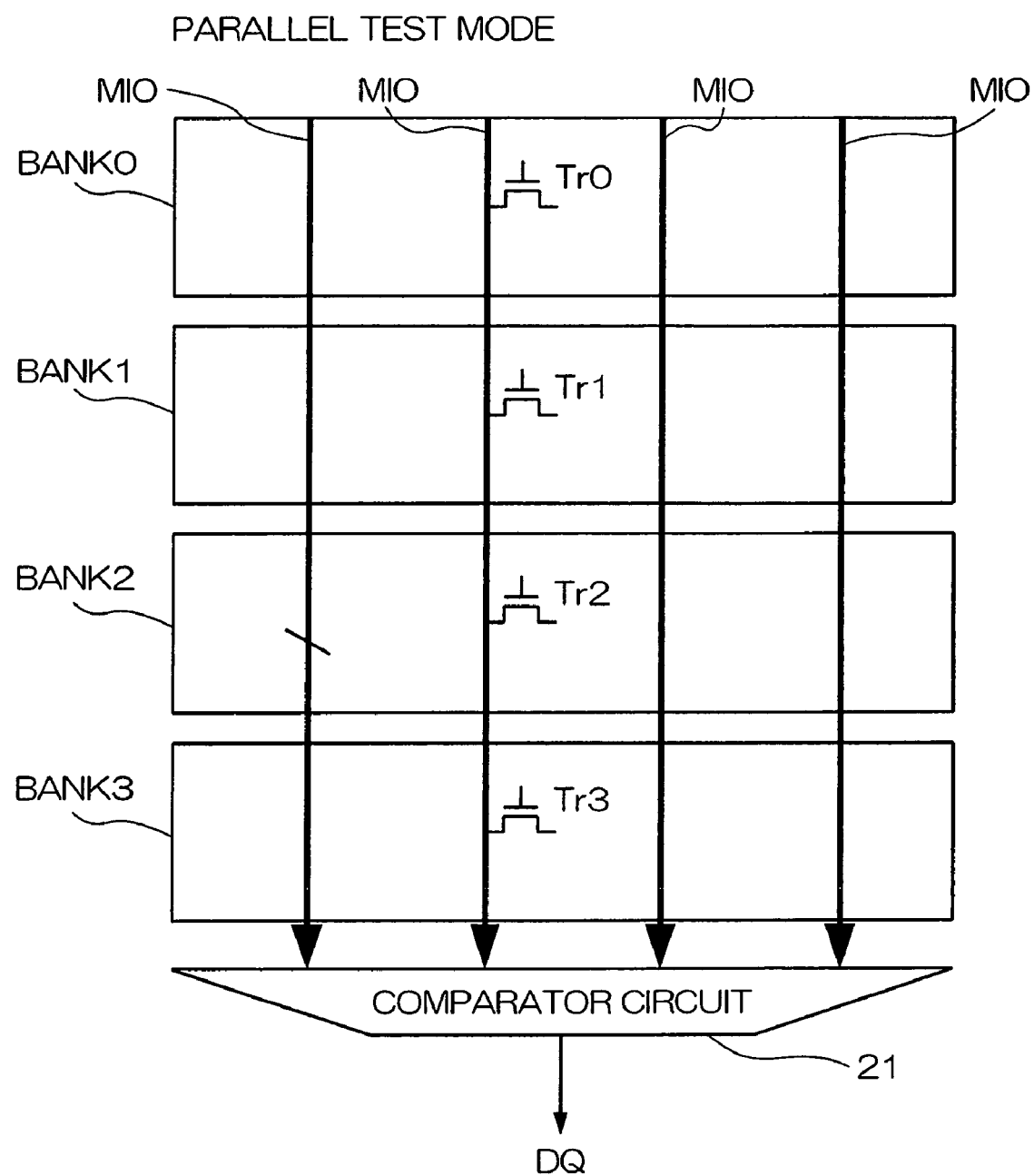
FIG. 8 is a block diagram that shows the connecting configuration of the semiconductor memory device shown in FIG. 7 during the parallel test mode.

In the connecting condition of the normal operation mode, a gate circuit, in other words, a plurality of transistors Tr A which act as a switch, are controlled to be in an on-state, MIO lines MIO-U and MIO-L, which are connected to both ends of the switch of the transistor Tr A (in other words, drain and source terminals), connect with each other, and hence, the MIO lines MIO-U and MIO-L compose each single signal line that is equal to the MIO line shown in FIG. 7. Therefore, an MIO line, which includes the MIO lines MIO-U and MIO-L and the transistor Tr A, is wired or located to traverse the 4 banks made of a bank 0 to a bank 3. In addition, peripheral circuits 11 and 12, to which data is transferred from each MIO line, are placed at one end of the MIO lines MIO-U and MIO-L, and output the transferred data to an external data input and output line (external DQ).

The transistor Tr A is provided at an intermediate position of the MIO line (between the MIO-U and the MIO-L), a high-voltage (Vpp) is applied to each gate terminal of the transistor Tr A which commonly connects with each other, and hence, the 4 banks becomes an electrical connecting state through the MIO line (MIO-U and MIO-L). The transistor Tr A is made of, for example, a low voltage thin film N-channel metal-oxide-semiconductor (MOS) transistor. The data from the 4 banks is output to the peripheral circuits 11 and 12 without conflict, since transistors Tr 0 to Tr 3 of each bank are controlled to not operate simultaneously.

On the other hand, in the connecting condition of the parallel test mode shown in FIG. 2, since a low-voltage (Vbb or ground voltage GND) is applied to the gate terminal of the transistor Tr A, each transistor Tr A is turned off. Thereby, the MIO line is electrically separated into a MIO-U part and a MIO-L part, that is, the MIO line is divided into two parts. Furthermore, transistors PU and PL, which are connected with one end of the MIO lines MIO-U and MIO-L, and act as the gate circuit or the switch activated during only the parallel test mode, are turned on, and hence, the MIO lines MIO-U and MIO-L are connected with the comparator circuits 22 and 23. That is, the comparator circuits 22 and 23 are parallel test determination circuits that correspond to the comparator circuit 21 shown in FIG. 7. The comparator circuits 22 and 23 input in parallel and compare signals of the MIO lines MIO-U and MIO-L divided from each MIO line by turning off a plurality of transistors Tr A. An output signal of the comparator circuits 22 and 23 is output to the external data input and output line DQ. A signal output from the comparator circuit 22 is an output signal DQ-U, while a signal output from the comparator circuit 23 is an output signal DQ-L.

Since the transistors PU and PL are controlled to be turned off during the normal operation mode, the comparator circuits 22 and 23 are electrically separated from each MIO line in this situation. That is, the connecting condition is the same as shown in FIG. 1.

Figure 9:
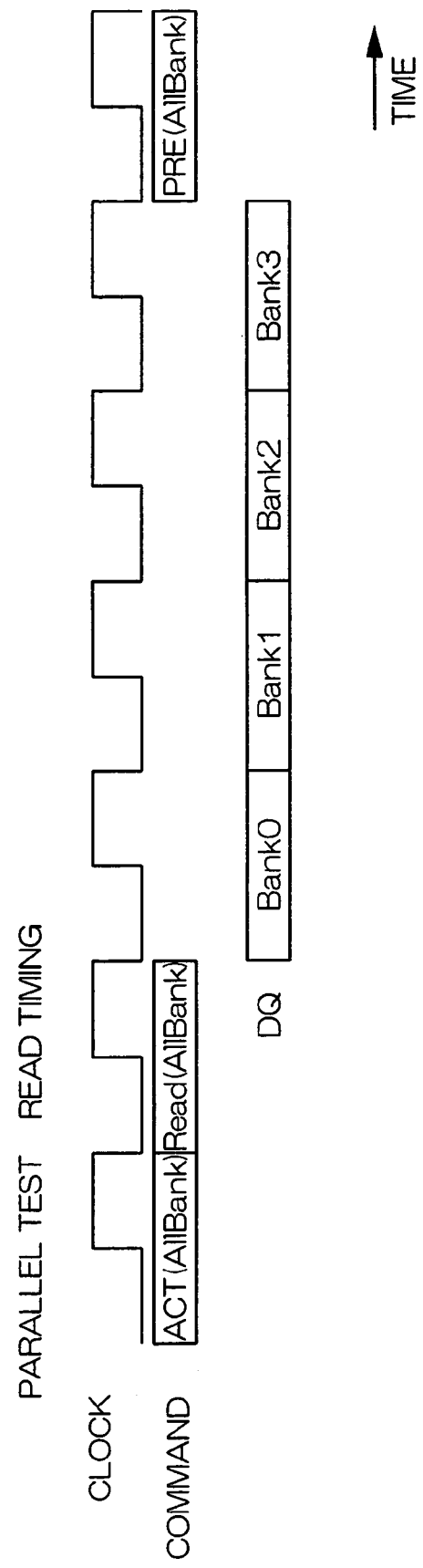
FIG. 9 is a timing chart that explains the operation of the parallel test mode in the configuration shown in FIG. 8.

A circuit operation during the parallel test mode of the first embodiment will be described hereinbelow with reference to FIG. 3. FIG. 3 shows a timing chart of the circuit operation of the configuration shown in FIG. 1, as is the case with FIG. 9. However, the output signals DQ-U and DQ-L are output from the comparator circuit 22 and 23 in parallel, as 2 signals as shown in FIG. 3.

During the parallel test mode, the active command ACT and the read command READ are simultaneously directed to all the banks, while the read data is output by sequentially activating the banks 0 and 1 connecting with the MIO line MIO-U and the banks 2 and 3 connecting with the MIO line MIO-L in the serial operation. That is, the banks 0 and 1 and the banks 2 and 3 are controlled so that the data of banks 0 and 2 is output before outputting the data of banks 1 and 3 by serially activating the transistors 0 and 1 and the transistors 2 and 3.

That is, according to the first embodiment of the present invention, a plurality of the gate circuits (transistor Tr A) are provided to every 2 banks (that is, a pair of banks 0 and 1, or a pair of banks 2 and 3), and provided at a position corresponding to a boundary of the banks so as to separate each MIO line. Therefore, the comparator circuits 22 and 23 input in parallel and compare the signals of the separated parts of the MIO line with a time division (time-sharing), in which the parallel number is "2" corresponding to the unit number of each divided bank "2". The comparator circuits 22 and 23 output in parallel the compared result (DQ-U including a data string of the bank 0 and the bank 1, and DQ-L including a data string of the bank 2 and the bank 3).

Second Embodiment

A second embodiment of the present invention will be described hereinbelow with reference to FIG. 4 to FIG. 6. The same reference code is provided to the same configuration shown in FIG. 4 to FIG. 6 as that shown in the other drawings.

A configuration of the second embodiment includes, for example, 4 banks. FIG. 4 shows a connecting condition of the normal operation mode. FIG. 5 shows a connecting condition of the parallel test mode. In the connecting condition of the normal operation mode shown in FIG. 4, a divisional number of the MIO line of the second embodiment is different from that of the first embodiment. That is, three pieces of the transistors Tr A are provided at an intermediate position of each MIO line so as to divides the MIO line into four pieces corresponding to each bank. The MIO line is divided into a MIO-U0 connected with the bank 0, a MIO-U1 connected with the bank 1, a MIO-L0 connected with the bank 2, and a MIO-L1 connected with the bank 3. The gate terminal of each transistor Tr A commonly connects with each other.

Figure 4:
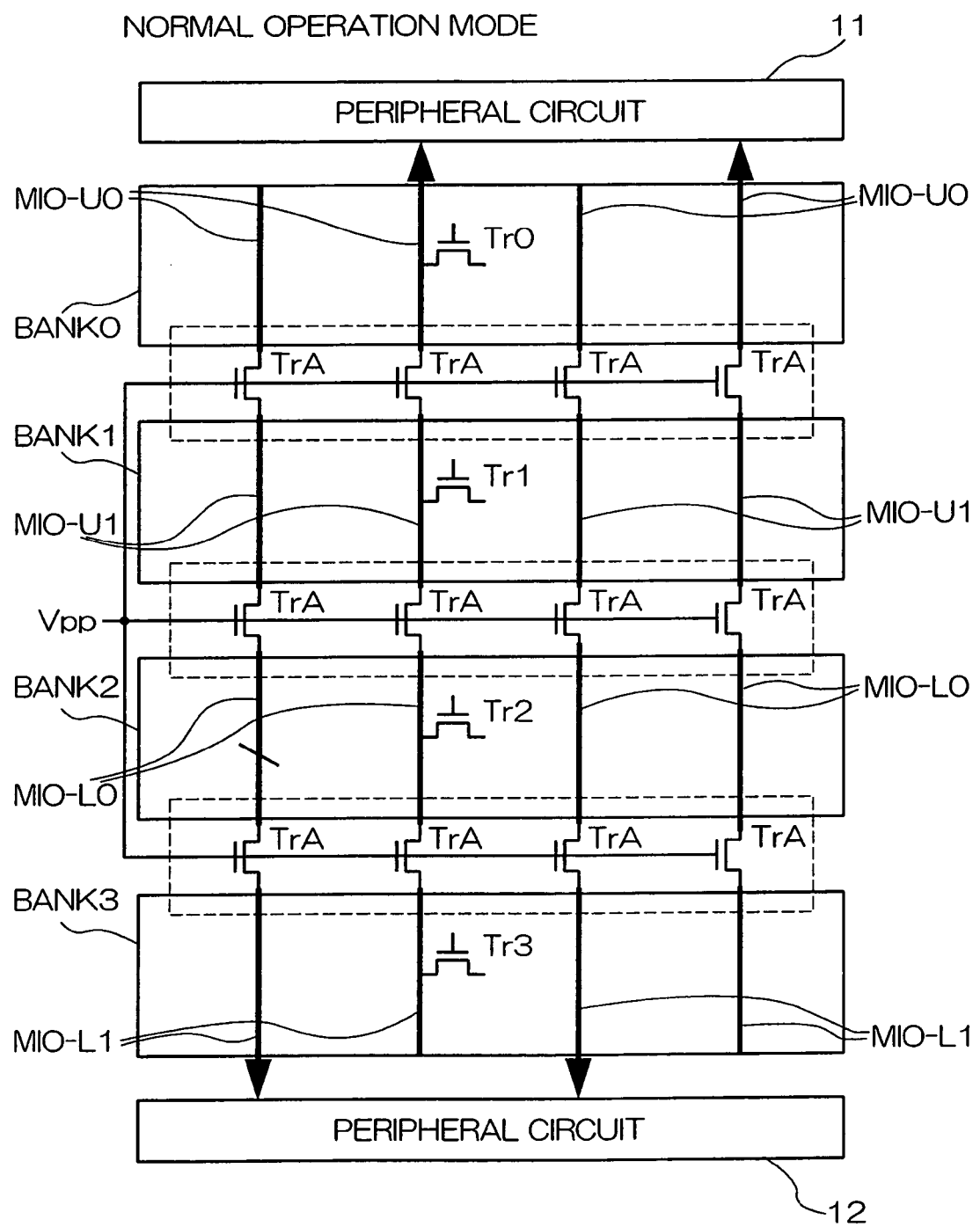
FIG. 4 is a block diagram that shows the connecting configuration of the semiconductor memory device during the normal operation mode, according to a second embodiment of the present invention.

In the connecting condition of the normal operation mode shown in FIG. 4, the gate circuit, in other words, each transistor Tr A which acts as the switch, is controlled to be in an on-state, MIO lines MIO-U0, MIO-U1, MIO-L0 and MIO-L1, which are connected at both ends of each of 3 switches of the transistor Tr A (in other words, drain and source terminals), become the electrical connecting state, and hence, the MIO lines MIO-U0, MIO-U1, MIO-L0 and MIO-L1 compose each single signal line that is equal to the MIO line shown in FIG. 7. Therefore, the MIO line, which includes the MIO lines MIO-U0, MIO-U1, MIO-L0 and MIO-L1 and the 3 transistors Tr A, is wired or located to traverse the 4 banks (bank 0 to bank 3). In addition, the peripheral circuits 11 and 12, to which data is transferred from each MIO line, are placed at one end of the MIO lines MIO-U0 and MIO-L1, and output the transferred data to an external data input and output line (external DQ).

The 3 transistors Tr A are provided at each position corresponding to the boundary of the banks, the high-voltage (Vpp) is applied to each gate terminal of the transistor Tr A during the normal operation mode, and hence, the 4 banks becomes the electrical connecting state through the MIO line. The data from the 4 banks is output to the peripheral circuits 11 and 12 without conflict, since transistors Tr 0 to Tr 3 of each bank are controlled to not operate simultaneously.

Figure 5:
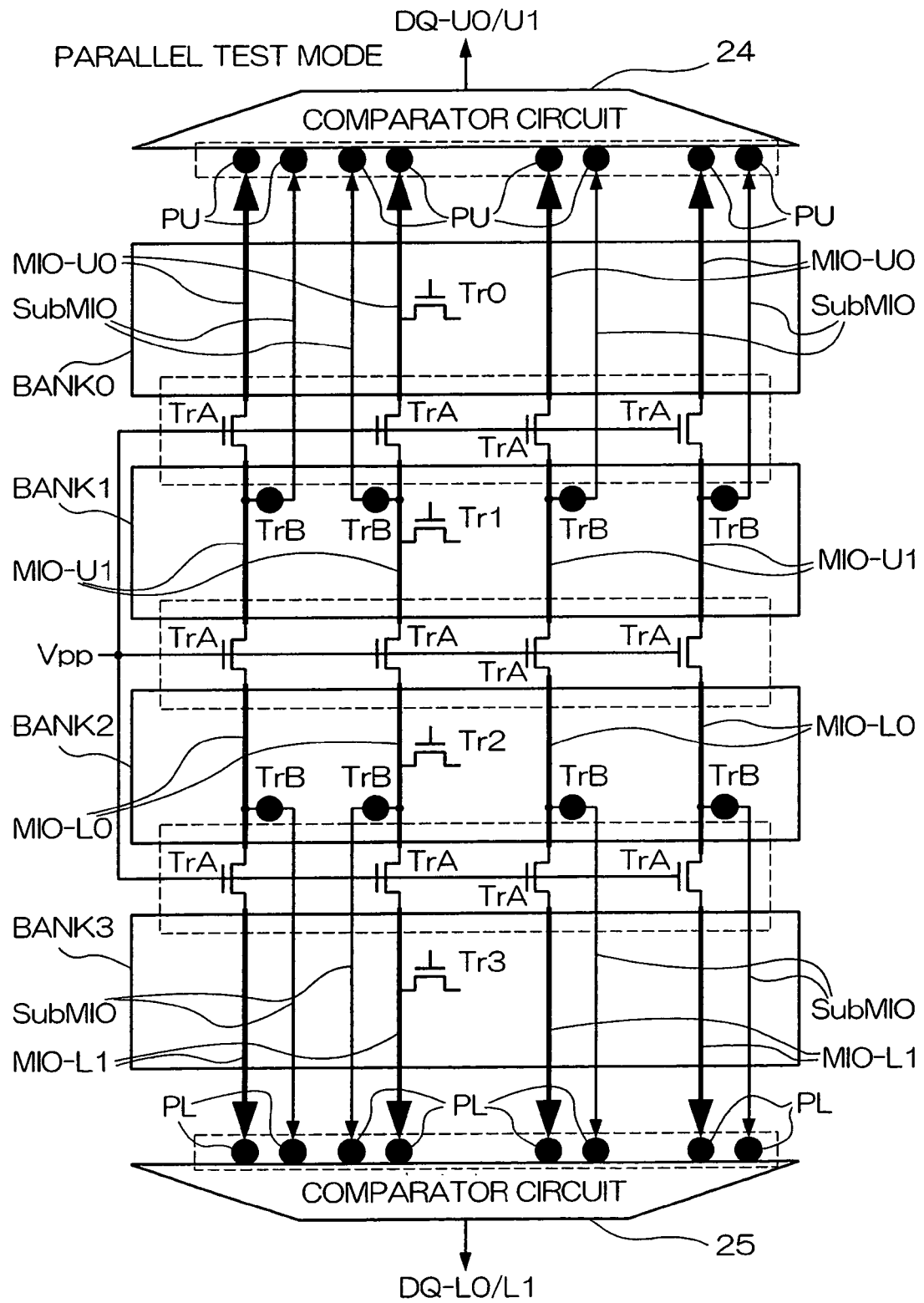
FIG. 5 is a block diagram that shows the connecting configuration of the semiconductor memory device shown in FIG. 4 during the parallel test mode, according to the second embodiment of the present invention.

On the other hand, in the connecting condition of the parallel test mode, as shown in FIG. 5, a MIO auxiliary line for the parallel test (hereinbelow referred to as a SubMIO line, and the SubMIO line may be narrower than the MIO line, that is, the SubMIO line may have a narrower width of a circuit layout than that of the MIO line) connects with the MIO lines MIO-U0, MIO-U1, MIO-L0 and MIO-L1 via a transistor Tr B turned on during only the parallel test mode.

During the parallel test mode, since the low-voltage (Vbb or ground voltage GND) is applied to the gate terminal of the transistor Tr A, each transistor Tr A is turned off. In addition, since the high-voltage (Vpp) is applied to the gate terminal of the transistor Tr B, each transistor Tr B is turned on. Thereby, the MIO line is electrically separated into a MIO-U0 part, a MIO-U1 part, a MIO-L0 part, and a MIO-L1 part, that is, the MIO line is divided into four parts. Furthermore, each of the separated parts of the MIO lines MIO-U0, MIO-U1, MIO-L0, and MIO-L1 is connected with the comparator circuits 24 and 25 by turning on the transistors PU and PL which act as the gate circuit or the switch activated during only the parallel test mode. The comparator circuits 24 and 25 of the present embodiment input signals of the MIO lines MIO-U0, MIO-U1, MIO-L0, and MIO-L1 in parallel, and compare the input signals to the every bank. Thereby, the comparator circuits 24 and 25 can output the result which is independently compared for the every bank. In this case, signals of the compared result, which are output to the external data input and output line DQ, include signals DQ-U0 and DQ-U1 (DQ-U0/U1) which correspond to the bank 0 and the bank 1, respectively, and are output from the comparator circuit 24, and signals DQ-L0 and DQ-L1 (DQ-L0/L1) which correspond to the bank 2 and the bank 3, respectively, and are output from the comparator circuit 25.

That is, according to the second embodiment of the present invention, each of the parts of the MIO lines MIO-U0, MIO-U1, MIO-L0, and MIO-L1 separated by the gate circuit made of the transistor Tr A, and the comparator circuits 24 and 25 are electrically connected by a connecting portion which includes the transistor Tr B controlled to be in the on-state during the parallel test mode, and the MIO auxiliary line SubMIO.

A circuit operation during the parallel test mode of the second embodiment will be described hereinbelow with reference to FIG. 6. FIG. 6 shows a timing chart of the circuit operation of the configuration shown in FIG. 4.

Figure 6:
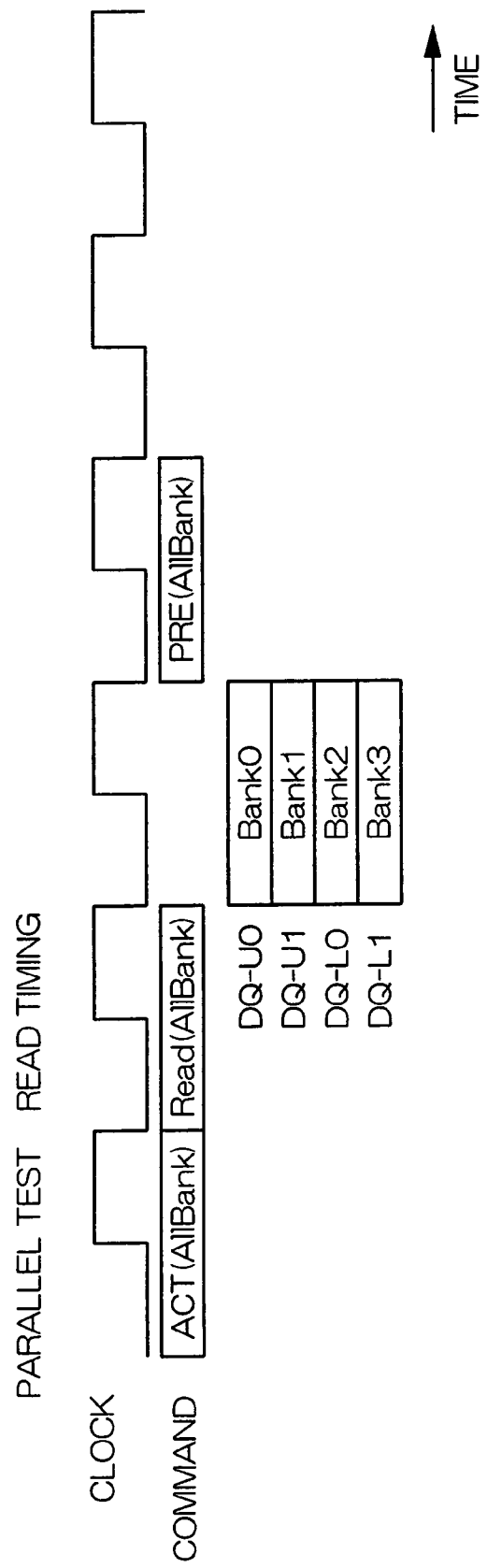
FIG. 6 is a timing chart that explains the operation of the parallel test mode in the configuration shown in FIG. 5, according to the second embodiment of the present invention.

During the parallel test mode, as shown in FIG. 6, the active command ACT and the read command READ are simultaneously directed to all the banks, while the data read from the bank 0 to the bank 3 is simultaneously output in parallel by controlling the transistors Tr 0, Tr 1, Tr 2, and Tr 3 of the banks to activate in parallel.

That is, according to the second embodiment of the present invention, a plurality of the gate circuit (transistor Tr A) are provided to every bank and provided at a position corresponding to a boundary of the banks so as to separate each MIO line. Therefore, the comparator circuits 24 and 25 input in parallel and compare the signals of the separated parts of the MIO lines MIO-U0, MIO-U1, MIO-L0, and MIO-L1. The comparator circuits 24 and 25 output in parallel the compared result (DQ-U0 of the bank 0, DQ-U1 of the bank 1, DQ-U2 of the bank 2, and DQ-U3 of the bank 3, shown in FIG. 6).

As described above, according to the first and second embodiments, the data of all the banks can be output to the external data input and output line DQ within a period shorter than that of a conventional configuration. For this reason, the testing time can be shortened so as to reduce the testing cost.

Moreover, while the preferred embodiment of the present invention have been described and illustrated above, the present invention is not to be considered as being limited by the foregoing description. A modification of the embodiments can be achieved without departing from the spirit or scope of the present invention, for example, a combination of the first and second embodiments (combination of the SubMIO line and the time-sharing output). Furthermore, numbers of the banks and MIO lines are exemplary, and the configuration having a lot of the banks and MIO lines further can be achieved. The MIO line described in the above embodiments corresponds to a data output line (in other words, signal line at least outputting data) described in the appended claims.

Subsequently, a modification of the above-mentioned embodiment of the present invention will be described hereinbelow. As described in the above related art of the present invention, in DRAM having a lot of MIO lines, if each bank is provided with the MIO line through which the memory cell of each bank outputs data to the peripheral circuit, the total number of the IO lines in the chip considerably increases, and the circuit line highly affects the chip layout and the space in DRAM that has a small storage capacity. As a method which reduces the number of the MIO lines, the same MIO line is commonly used by a plurality of the banks instead of the MIO line with which each bank is provided, and further the control of the bank unit is applied to the transistor, which outputs data to the MIO line, and hence, the reduction in the number of the MIO lines is achieved. When the parallel test is carried out in such a DRAM, since the conflict of data output from each bank takes place in the same MIO line commonly used by a plurality of the banks, a plurality of the banks are not allowed to operate simultaneously. For this reason, according to the above-mentioned embodiments of the present invention, in order to increase the parallel number of the parallel test without the above restriction, the gate circuit (or gate, transistor Tr A), which plays a role of the switch, is provided at the MIO line.

For example, according to the first embodiment (refer to FIG. 2), during the parallel test mode, a plurality of the transistors Tr A, which act as the gate circuit, or the switch, are turned off. In this case, the MIO line is independently connected with each pair of the banks, and hence, the parallel test data of each bank can be individually output to the peripheral circuit or a pad which connect with the MIO line corresponding to the bank.

A circuit operation of the data writing and reading during the parallel test mode of according to the first embodiment of the present invention, shown in FIG. 1 and FIG. 2, will be described hereinbelow with reference to FIG. 10 to FIG. 12B. The same reference code is provided to the same configuration shown in FIG. 10 to FIG. 12B and the other drawings as that shown in FIG. 1 and FIG. 2.

Figure 10:
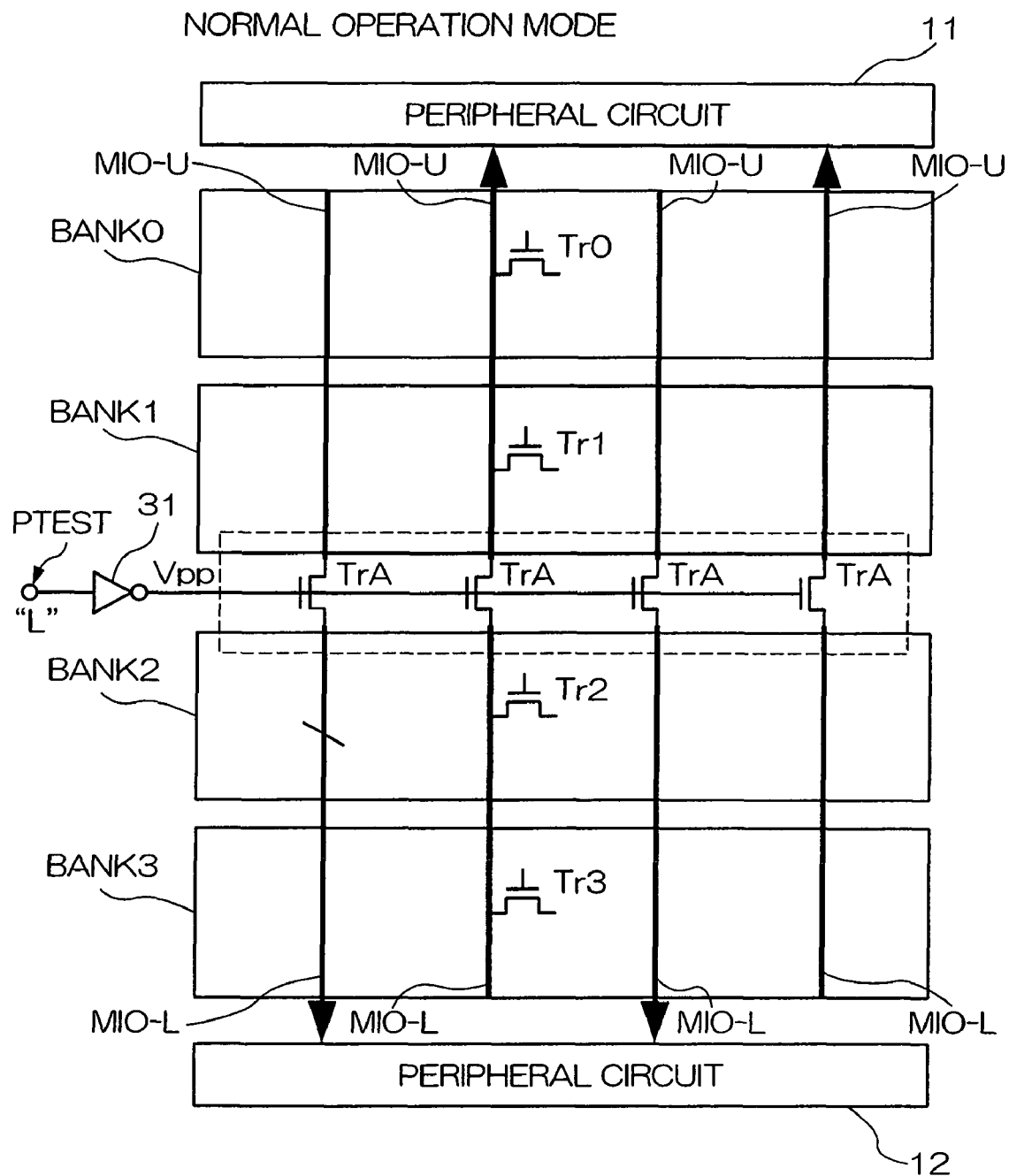
FIG. 10 is a block diagram that shows another connecting configuration of the semiconductor memory device shown in FIG. 1 during the normal operation mode, according to the first embodiment of the present invention, wherein an inverter element that controls a transistor Tr A is shown in the block diagram.
Figure 11:
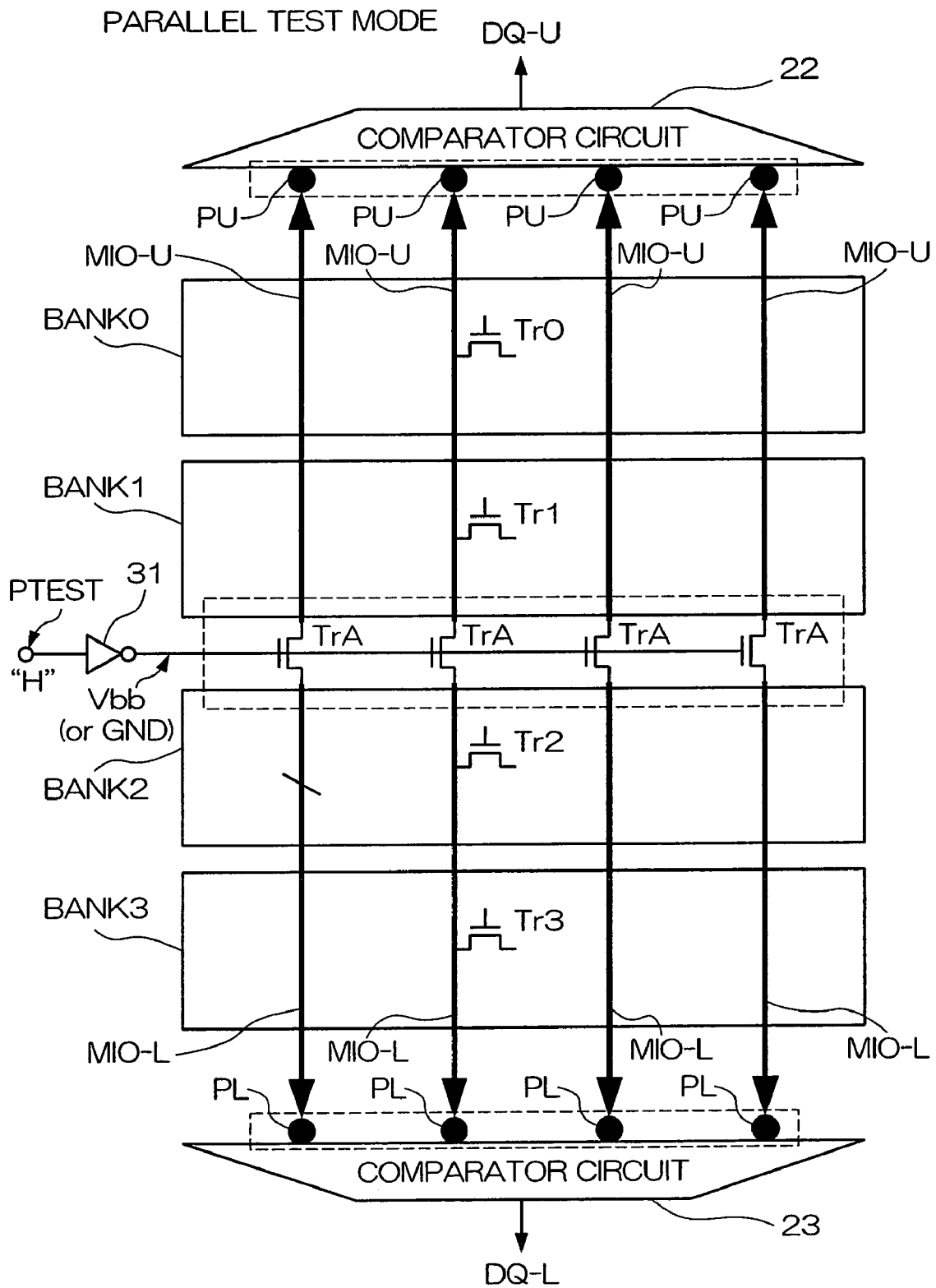
FIG. 11 is a block diagram that shows the another connecting configuration of the semiconductor memory device shown in FIG. 2 during the parallel test mode, according to the first embodiment of the present invention, wherein the inverter element that controls the transistor Tr A is shown in the block diagram.

FIG. 10 and FIG. 11 show connecting configurations of the semiconductor memory device that includes 4 banks, as is the case with FIG. 1 and FIG. 2, during the normal operation mode and the parallel test mode. Although, an inverter element 31, whose output terminal is connected with each transistor Tr A, is provided in a configuration shown in FIG. 10 and FIG. 11, in addition to the configuration shown in FIG. 1 and FIG. 2, the other configuration is the same as that shown in FIG. 1 and FIG. 2.

The output of the inverter element 31 is placed at the Vpp level at an "H" level and the Vbb or GND level at an "L" level. A signal PTEST is input to the inverter element 31. The signal PTEST is placed at an "H" level during the parallel test mode and an "L" level during a period except the parallel test mode (normal operation mode). The level of the signal PTEST is set, in response to a predetermined command input from outside or a signal input to the predetermined pad. In the connecting condition of the normal operation mode shown in FIG. 10, the signal PTEST is placed at an "L" level, the inverter element 31 outputs the Vpp level, and hence, the transistor Tr A is controlled to be turned on. On the other hand, in the connecting condition of the parallel test mode shown in FIG. 11, the signal PTEST is placed at an "H" level, the inverter element 31 outputs the Vbb or GND level, and hence, the transistor Tr A is controlled to be turned off.

Usually, the same data is written to all the banks during the parallel test mode. In the connecting condition of the parallel test mode shown in FIG. 11, output lines DQ-U and DQ-L of the comparator circuits 22 and 23 electrically are connected with the MIO lines MIO-U and MIO-L when the data is written, and hence, the data of the output lines DQ-U and DQ-L is written to the memory cell provided in the banks 0 and 1 and the banks 2 and 3. The output lines DQ-U and DQ-L correspond to a high-order bit and a low-order bit of the external data input and output line (external DQ), and their signal line numbers are assumed to be smaller than those of the external DQ, respectively. For example, when the signal line number of the external DQ (that is, equal to a bit number) is even, the numbers of the output lines DQ-U and DQ-L can be set to a half of the signal line number of the external DQ. On the other hand, the numbers of the MIO lines MIO-U and MIO-L are assumed to be the same as the bit number of the external DQ. That is, the bit numbers of the MIO lines MIO-U and MIO-L are larger than those of the output lines DQ-U and DQ-L.

In this configuration, during the parallel test mode (transistor Tr A being turned off), in order to write test data having the same bit number of the external DQ to the memory cell provided in the banks 0 and 1, for example, the output line DQ-U connects with the half of the MIO line MIO-U corresponding to a high-order part, and hence, a half of data of the same bit number of the external DQ corresponding to a high-order part. Then, the output line DQ-U connects with the half of the MIO line MIO-U corresponding to a low-order part, and hence, a half of the data with the same bit number as the external DQ corresponding to a low-order part. Likewise, during the parallel test mode, in order to write the test data having the same bit number of the external DQ to the memory cell provided in the banks 2 and 3, for example, the output line DQ-L connects with the half of the MIO line MIO-L corresponding to a high-order part, and hence, a half of data of the same bit number of the external DQ corresponding to a high-order part. Then, the output line DQ-L connects with the half of the MIO line MIO-L corresponding to a low-order part, and hence, a half of the data of the same bit number of the external DQ corresponding to a low-order part. That is, in this case, data writing by using the external DQ and the output lines DQ-U and DQ-L is required to repeat at least twice. In addition, a circuit, which controls the connection and switch of each signal line as described above, is provided in the comparator circuits 22 and 23 and the other peripheral circuit unillustrated, according to FIG. 10, FIG. 11, and embodiments described hereinafter.

A circuit operation of writing and reading data for the test during the parallel test mode of the configuration shown in FIG. 11 will be described hereinbelow with reference to FIG. 12A and FIG. 12B. A signal PTEST, the clock signal, the command input from the outside, the variations of the data of the output lines DQ-U and DQ-L of the comparator circuits 22 and 23 are shown, from the top to the bottom in order, in FIGS. 12A and 12B. FIG. 12A shows a timing chart of the data write operation, and FIG. 12B shows a timing chart of the data read operation following the data write operation shown in FIG. 12A.

In the data write operation during the parallel test mode, when the switch between each bank, or the transistor Tr A, is turned off, writing data written to the memory cell can be input only through a DQ part (DQ-U or DQ-L) which is connected with the MIO line connecting the bank in the configuration shown in FIG. 11. In order to write the writing data having the same amount of the external DQ (same bit number) during the parallel test mode when the transistor Tr A is turned off, Data 1 and Data 2 are required to be input through the output lines DQ-U and DQ-L in serial, as shown in FIG. 12A, where the Data 1 and Data 2 correspond to the data which is divided in half from data having the same bit number as the external DQ.

That is, the signal PTEST is always set to an "H", and hence, each transistor Tr A is always set to an off-state in the operation shown in FIG. 12A. During the data write operation, the bank active command for all the banks "ACT (All Bank)" is input at first, and then, a write command for all the banks "Write (All Bank)" is input. Together with a timing of the write command for all the banks "Write (All Bank)", "Data 1 (Bank 0-1)" and "Data 1 (Bank 2-3)" are input in parallel from the external DQ, hence, the data of the output line DQ-U "Data 1" is written to the memory cell of the banks 0 and 1, and the data of the output line DQ-L "Data 1" is written to the memory cell of the banks 2 and 3. Subsequently, "Data 2 (Bank 0-1)" and "Data 2 (Bank 2-3)" are input in parallel from the external DQ, hence, the data of the output line DQ-U "Data 2" is written to the memory cell of the banks 0 and 1, and the data of the output line DQ-L "Data 2" is written to the memory cell of the banks 2 and 3. After that, a precharge command for all the banks "PRE (All Bank)" is input, all the banks are precharged, and then, each bank is in an idle state.

During the data read operation, as shown in FIG. 12B, when the bank active command for all the banks "ACT (All Bank)" followed by the read command for all the banks "Read (All Bank)" is input, the data of the bank 0 (hereinbelow referred to as a determination result) is output to the output line DQ-U, and the data of the bank 2 is output to the output line DQ-L. Subsequently, the data of the bank 1 is output to the output line DQ-U, and the data of the bank 3 is output to the output line DQ-L. After that, the precharge command for all the banks "PRE (All Bank)" is input, all the banks are precharged, and then, each bank is in the idle state.

As described above, when the data having the same bit number as the external DQ is written as the test data, since each MIO line is divided in the two parts by the transistor Tr A in the configuration shown in FIG. 11, the data Data 1 and Data 2, which are divided in half from the data of the external DQ, is written by using the MIO lines MIO-U and MIO-L in serial twice. The circuit operation of the reading data is the same as that shown in FIG. 3 according to the first embodiment of the present invention. On the other hand, during the normal operation mode, that is, in the connecting condition, in which the MIO line is commonly used between each of the banks by the transistor Tr A being turned on, the data having the same bit number as the external DQ can be written to the memory cell at once. That is, when the configuration of the MIO line divided by the transistor Tr A shown in FIG. 11 is employed, as a result, it takes a time more than the case without the division of the MIO line by the transistor Tr A, only when writing the data.

Therefore, a semiconductor memory device will be disclosed in another embodiments described hereinbelow (embodiments 3 and 4), which can reduce the testing time rather than the case of the above embodiments with keeping an availability during the parallel test mode and the data reading, for example, by taking away a necessity of inputting data in serial during the parallel test mode and the data reading.

In this manner, an advantageous effect, which can reduce the testing cost, is obtained by a decrease in the testing time.

Third Embodiment

Figure 13:
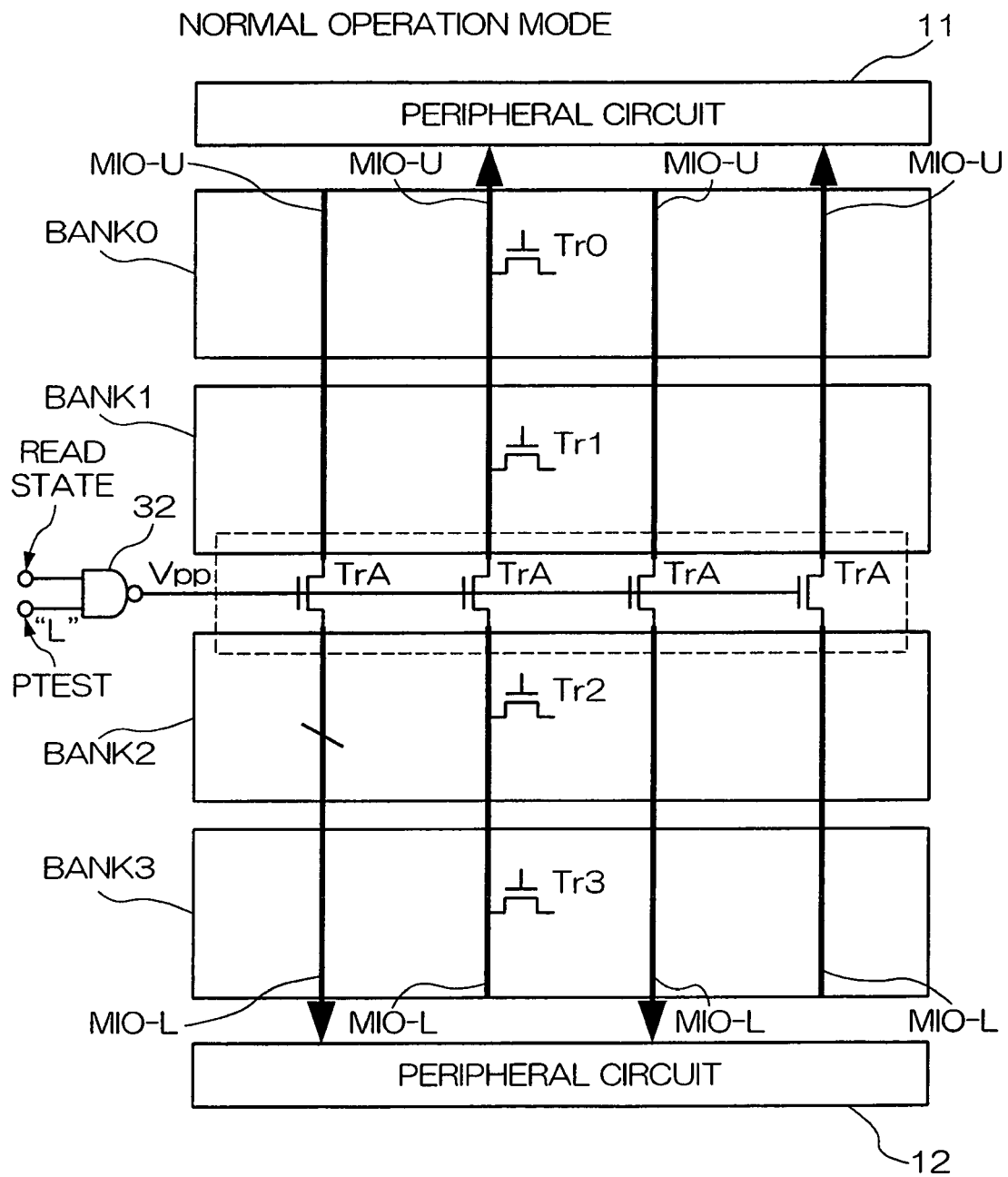
FIG. 13 is a block diagram that shows the connecting configuration of the semiconductor memory device during the normal operation mode, according to a third embodiment of the present invention.
Figure 14:
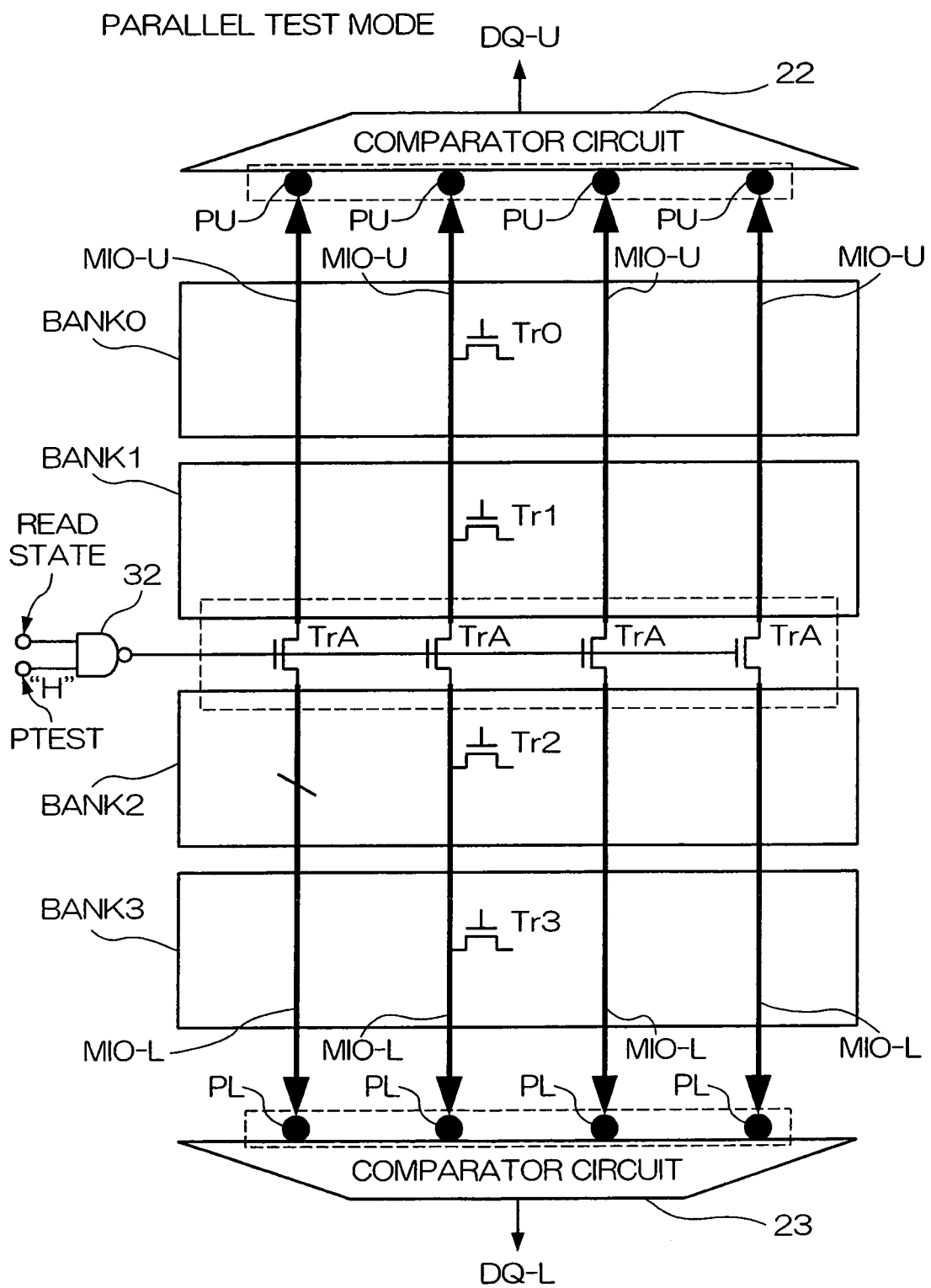
FIG. 14 is a block diagram that shows the connecting configuration of the semiconductor memory device shown in FIG. 13 during the parallel test mode, according to the third embodiment of the present invention.

As shown in FIG. 13 and FIG. 14, a semiconductor memory device, in which the MIO line is commonly used by a plurality of the banks and the data is output from the memory cell array to the peripheral circuit through the MIO line, will be described in a third embodiment of the present invention. The feature of this semiconductor memory device is gate control of the transistor Tr A, as the switch, provided at the intermediate position of the MIO line (between the MIO-U and the MIO-L), wherein the gate control is made not by continuing the off-state of the transistor Tr A during the parallel test mode, but the transistor Tr A is turned off by a logical AND operation of the signal PTEST for controlling a parallel test state and a signal READ STATE for controlling a readout state. That is, the transistor Tr A is controlled to be turned off in the readout operation of the parallel test, while the transistor Tr A is controlled to be turned on in an operation except the readout, for example, a writing operation (data write operation) of the parallel test. Thereby, since the MIO line becomes the electrical connecting state between the banks in a writing state of the parallel test, it is possible to simultaneously write data to the memory cell of all the banks.

The third embodiment of the present invention will be described hereinbelow with reference to FIG. 13 to FIG. 15B. FIG. 13 and FIG. 14 show connecting configurations of the semiconductor memory device that includes 4 banks, as is the case with FIG. 10 and FIG. 11, during the normal operation mode and the parallel test mode. Although, a NAND circuit (NAND element) 32, which controls each transistor Tr A, is provided in a configuration shown in FIG. 13 and FIG. 14, instead of the inverter element 31 whose output terminal is connected with each transistor Tr A, the other configuration is the same as to the configuration shown in FIG. 10 and FIG. 11. The output of the NAND circuit 32 is placed at the Vpp level at an "H" level and the Vbb or GND level at an "L" level. The signal PTEST and the signal READ STATE are input to the NAND circuit 32. The signal PTEST is placed at an "H" level during the parallel test mode and an "L" level during the period except the parallel test mode (normal operation mode). The signal READ STATE is placed at an "H" level in the readout state and an "L" level in a state except the readout state. The level of the signal PTEST and the signal READ STATE is set, for example, in response to a predetermined command input from the outside or a signal input to the predetermined pad. During the normal operation mode shown in FIG. 13, since the signal PTEST is placed at an "L" level, the output of the NAND circuit 32 is placed at the Vpp level ("H" level) regardless of the level of signal READ STATE, and the transistor Tr A is controlled to be turned on. On the other hand, the signal PTEST is placed at an "H" level during the parallel test mode shown in FIG. 14. Thereby, when the signal READ STATE is placed at an "H" level corresponding to the readout state, the output of the NAND circuit 32 is placed at the Vbb or GND level, and hence, the transistor Tr A is controlled to be turned off. When the signal READ STATE is placed at an "L" level corresponding to the state except the readout state, the output of the NAND circuit 32 is placed at the Vpp level, and hence, the transistor Tr A is controlled to be turned on.

That is, the configuration of the third embodiment includes 4 banks as shown in FIG. 13 and FIG. 14. The MIO line is wired or located to traverse the 4 banks. The peripheral circuits 11 and 12, to which data is transferred from each MIO line, are placed at both ends of the MIO lines, and output the transferred data to the external DQ. The transistors PU and PL, which are activated during only the parallel test mode, are provided at one end of the MIO lines MIO-U and MIO-L as shown in FIG. 14. The comparator circuits 22 and 23, as the parallel test determination circuit, are connected with the MIO lines MIO-U and MIO-L. In addition, the transistor Tr A is provided at the intermediate position of each MIO line (between the MIO-U and the MIO-L). The output of the NAND circuit 32 is input to the gate terminal of each transistor Tr A. The signal PTEST for controlling the parallel test state and the signal READ STATE for controlling the readout state are input to two input terminals of the NAND circuit 32, respectively. That is, a plurality of transistors Tr A are disclosed in the third embodiment, in which the plurality of the transistors Tr A are provided at the intermediate position of the MIO line commonly used by the banks, controlled to be turned on during the normal operation mode, and controlled to be turned off at least when being in the readout state during the parallel test mode.

As described above, FIG. 13 shows the connecting configuration of the semiconductor memory device during the normal operation mode, in which the signal PTEST is placed at an "L" level. In this case, since the output of the NAND circuit 32 is placed at the Vpp level, in which the Vpp is an example of a voltage higher enough than a threshold voltage Vt of the transistor Tr A, the Vpp level is applied to the gate terminal of each transistor Tr A, and hence, the 4 banks become the electrical connecting state through the MIO line. Therefore, the data from the 4 banks can be output to the peripheral circuits 11 and 12 without conflict, since transistors Tr 0 to Tr 3 of each bank are controlled to not operate simultaneously.

Figure 15A:
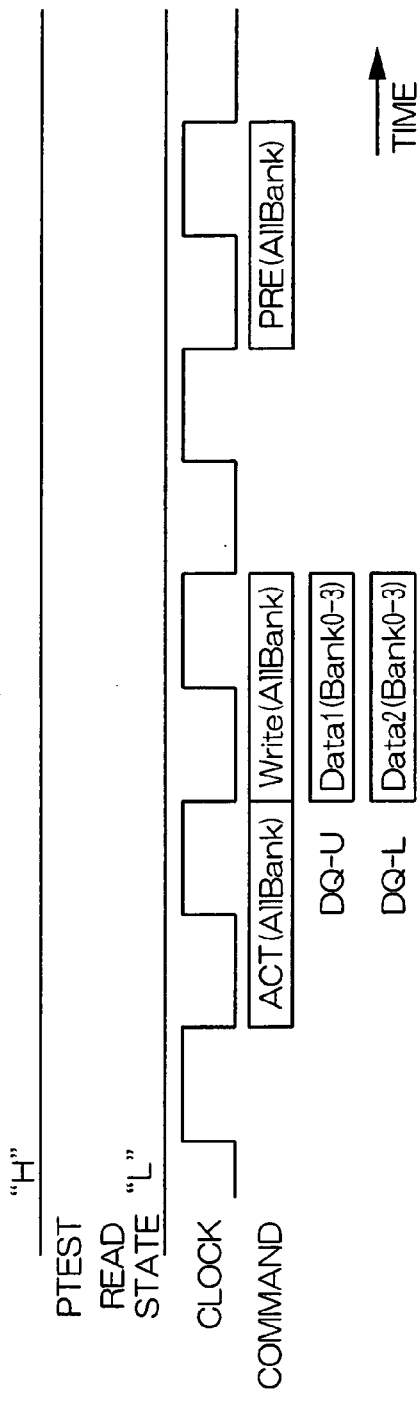
FIG. 15A is a timing chart that explains the data write operation of the parallel test mode in the configuration shown in FIG. 14, according to the third embodiment of the present invention.
Figure 15B:
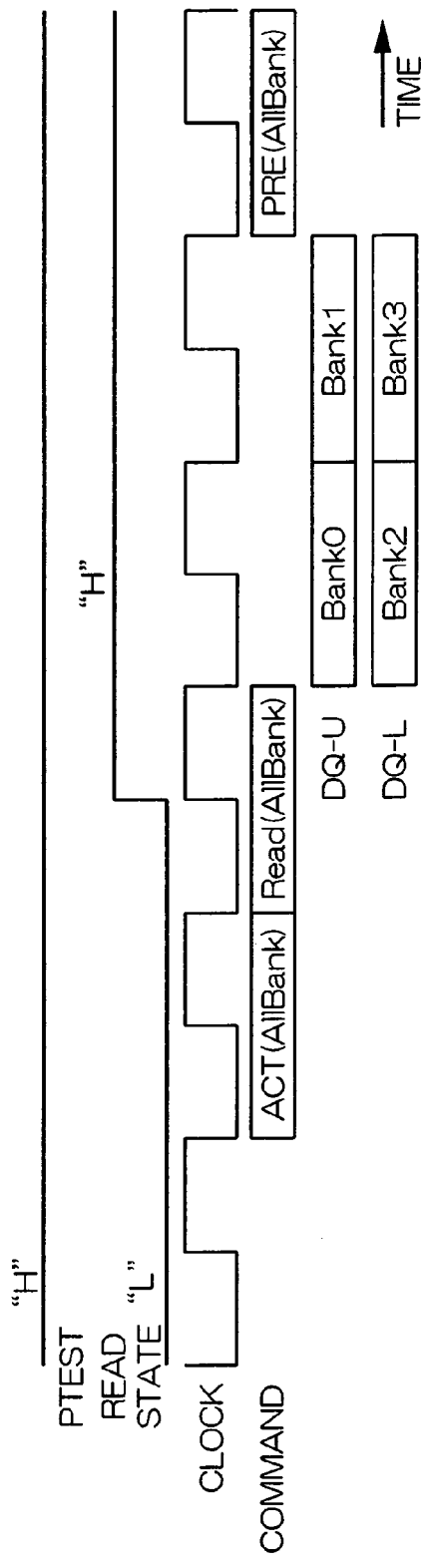
FIG. 15B is a timing chart that explains the data read operation of the parallel test mode in the configuration shown in FIG. 14, according to the third embodiment of the present invention.

Subsequently, the circuit operation during the parallel test mode of the third embodiment will be described hereinbelow with reference to FIG. 15A and FIG. 15B. FIG. 15A shows a timing chart of the signal, the command, and the external DQ in the data write operation, and FIG. 15B shows a timing chart of the signal, the command, and the external DQ in data read operation following the data write operation shown in FIG. 15A. The signal PTEST is placed at an "H" level during the parallel test mode. In the writing state, the signal READ STATE remains in an "L" level as shown in FIG. 15A. Therefore, the NAND circuit keeps outputting the Vpp level. In this case, as is the case with the normal operation mode, the 4 banks becomes the electrical connecting state through the MIO line. In this writing state, the bank active command for all the banks "ACT (All Bank)" is input at first, and then, the write command for all the banks "Write (All Bank)" is input. Together with the timing of the write command for all the banks "Write (All Bank)", "Data 1 (Bank 0-3)" is input from the external DQ of the DQ-U side (in other words, the high-order bit of the external DQ) to the MIO line MIO-U, for example, corresponding to the high-order bit, and "Data 2 (Bank 0-3)" is input from the external DQ of the DQ-L side (in other words, the low-order bit of the external DQ) to the MIO line MIO-L, for example, corresponding to the low-order bit. Since the MIO line is in the electrical connecting state, the data of the external DQ can be simultaneously written to all the banks (banks 0 to 3).

In the readout state of the parallel test mode, as shown in FIG. 15B, the bank active command for all the banks "ACT (All Bank)" is input at first, and then, the read command for all the banks "Read (All Bank)" is input. Together with the timing of the read command for all the banks "Read (All Bank)", the signal READ STATE for controlling the readout state is pulled up from an "L" level to an "H" level, and the NAND circuit 32 outputs the Vbb level, in which the Vbb is an example of a voltage lower enough than the threshold voltage Vt of the transistor Tr A. During a period of the NAND circuit 32 outputting the Vbb level, the transistor Tr A is turned off, and hence, the MIO line is electrically separated into the MIO-U part and the MIO-L part. In this separated state, a readout result of data of the memory cell array of the banks 0 and 1 and the banks 2 and 3 can be simultaneously output to the MIO-U and the MIO-L, respectively. As set forth, the bank active command ACT and the read command Read are simultaneously directed to all the banks, while the banks 0 and 1 and the banks 2 and 3 are controlled so that the data of banks 0 and 2 is output before outputting the data of banks 1 and 3 by controlling to serially activate the transistors 0 and 1 and the transistors 2 and 3.

FIGS. 15A and 15B include the signal READ STATE added to FIGS. 12A and 12B. The signal PTEST, the signal READ STATE, the clock signal, the command input from the outside, the variations of the data of the output lines DQ-U and DQ-L of the comparator circuits 22 and 23 are shown, from the top to the bottom in order, in FIGS. 15A and 15B.

Fourth Embodiment

A fourth embodiment of the present invention will be described hereinbelow with reference to FIG. 16 to FIG. 17B.

Figure 16:
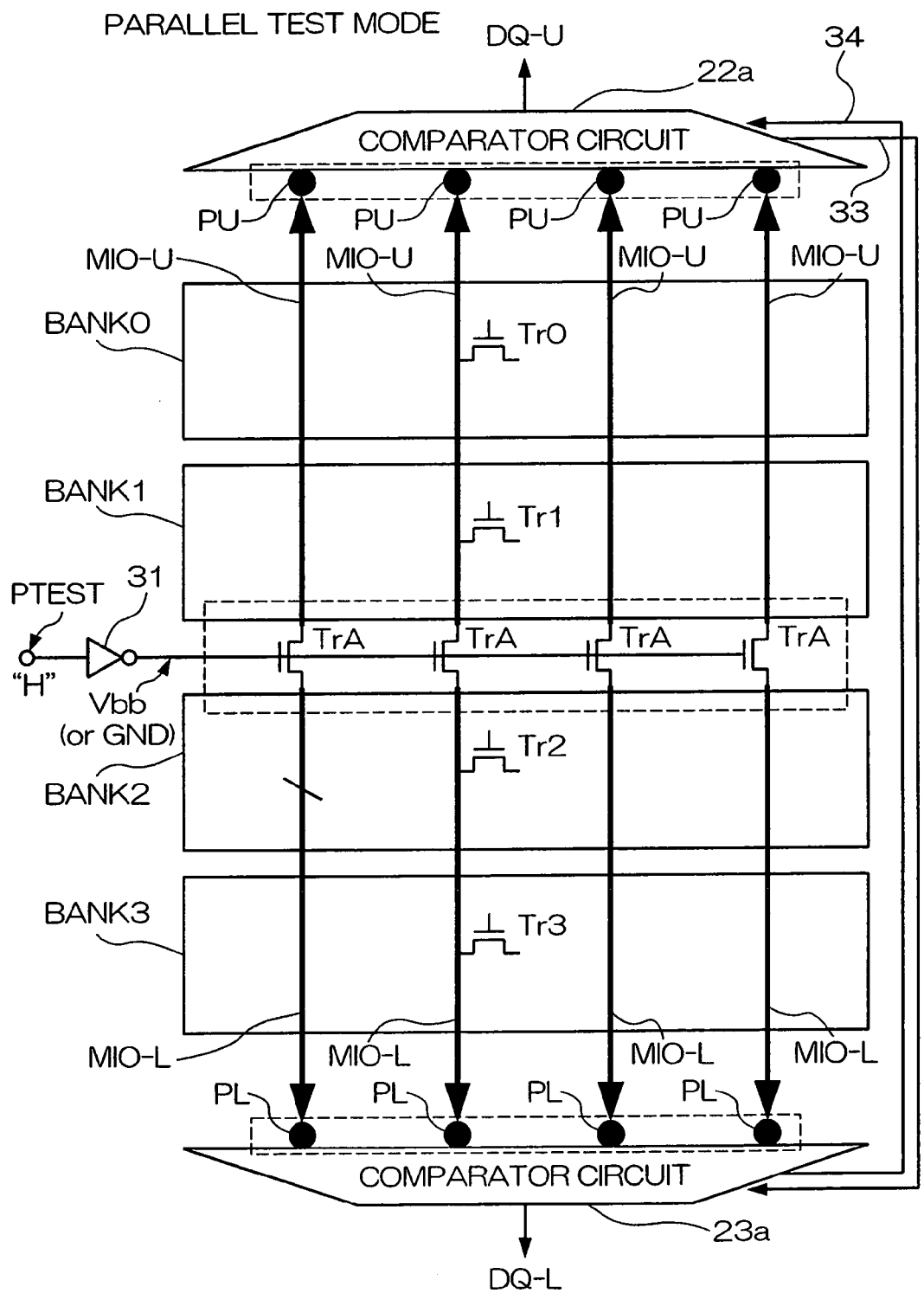
FIG. 16 is a block diagram that shows the connecting configuration of the semiconductor memory device during the normal operation mode, according to a fourth embodiment of the present invention.

FIG. 16 shows the connecting configuration of a semiconductor memory device according to the fourth embodiment of the present embodiment. The semiconductor memory device includes 4 banks, as is the case with FIG. 11, during the parallel test mode. The semiconductor memory device further includes a data line 33 and a data line 34 which are provided at outside of the memory array (bank array) as shown in FIG. 16, in which the data line 33 transfers data of the output line DQ-U to the output line DQ-L side, and the data line 34 transfers data of the output line DQ-L to the output line DQ-U side. Moreover, the comparator circuits 22 and 23 shown in FIG. 11 are replaced to comparator circuits 22a and 23a, in which the comparator circuits 22a and 23a further include a connection circuit that connects the data lines 33 and 34 with the output lines DQ-U and DQ-L. The comparator circuit 22a can obtain data having the same bit number of the external DQ by combining the data of the output line DQ-U and the data line 34. The combined data is input to the MIO line MIO-U. On the other hand, the comparator circuit 23a can obtain data having the same bit number of the external DQ by combining the data of the output line DQ-L and the data line 33. The combined data is input to the MIO line MIO-U. The other configuration shown in FIG. 16 is the same when compared to the configuration shown in FIG. 11. The configuration during the normal operation mode is the same as the configuration shown in FIG. 10.

That is, the configuration of the fourth embodiment includes 4 banks as shown in FIG. 10 (normal operation mode) and FIG. 16 (parallel test mode). The MIO line is wired or located to traverse the 4 banks. The peripheral circuits 11 and 12, to which data is transferred from each MIO line, are placed at both ends of the MIO lines, and output the transferred data to the external DQ. The transistors PU and PL, which are activated during only the parallel test mode, are provided at one end of the MIO lines MIO-U and MIO-L as shown in FIG. 16. The comparator circuits 22a and 23a, as the parallel test determination circuit, are connected with the MIO lines MIO-U and MIO-L. In addition, the transistor Tr A is provided at the intermediate position of each MIO line (between the MIO-U and the MIO-L). The output of the inverter element 31 is input to the gate terminal of each transistor Tr A. The signal PTEST for controlling the parallel test state is input to the input terminal of the inverter element 31. The configuration of the fourth embodiment further includes the data lines 33 and 34 which transfers the writing data input to one end of the MIO lines MIO-U and MIO-L separated by the transistor Tr A during the parallel test mode, to the other end of the MIO lines MIO-U and MIO-L.

In the configuration described above, during the parallel test mode, the signal PTEST is placed at an "H" level, the transistor Tr A is turned off, and hence, the parallel number of the parallel test can be increased in the readout operation.

On the other hand, in the writing operation of the parallel test, the data having the same bit number of the external DQ can be simultaneously written from the MIO lines MIO-U and MIO-L by using the data lines 33 and 34 which are provided outside of the memory array (bank array), and are exclusively used to interchange the data of the Data 1 and Data 2 between the DQ-U side and the DQ-L side. The Data 1 and the Data 2 correspond to the data which is divided in half from the data having the same bit number of the external DQ, as described above.

Figure 17A:
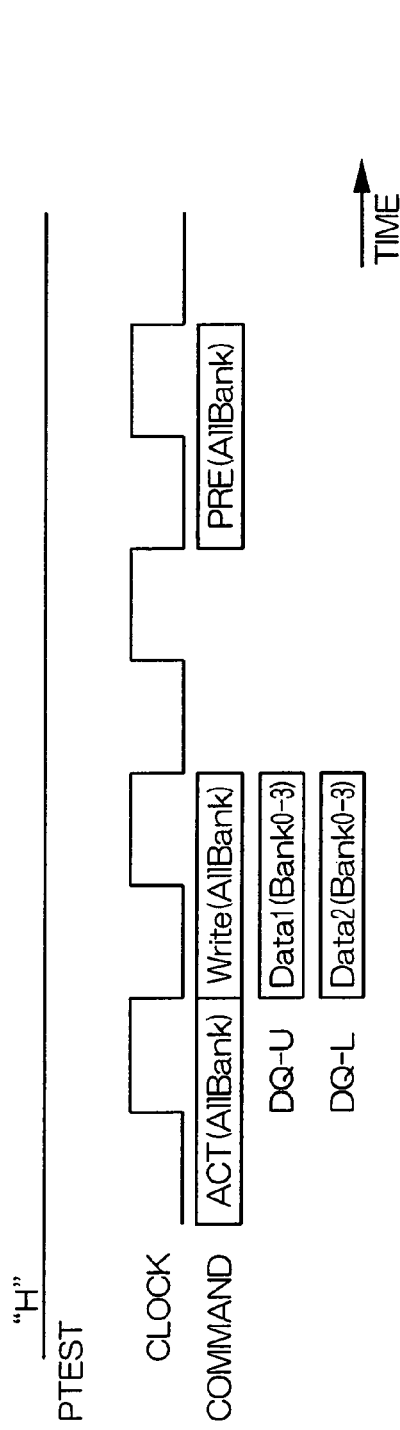
FIG. 17A is a timing chart that explains the data write operation of the parallel test mode in the configuration shown in FIG. 16, according to the fourth embodiment of the present invention.

Subsequently, the circuit operation during the parallel test mode of the fourth embodiment will be described hereinbelow with reference to FIG. 17A and FIG. 17B. FIG. 17A shows a timing chart of the signal, the command, and the external DQ in the data write operation, and FIG. 17B shows a timing chart of the signal, the command, and the external DQ in the data read operation following the data write operation shown in FIG. 17A. The Data 1 and the Data 2, which are input from the output lines DQ-U and DQ-L, are input to the DQ-L side and the DQ-U side by using the data lines 33 and 34 which are exclusively used for the data writing. Thereby, even when the transistor Tr A is turned off, the Data 1 and the Data 2 can be simultaneously written from the DQ-U side and the DQ-L side.

Figure 17B:
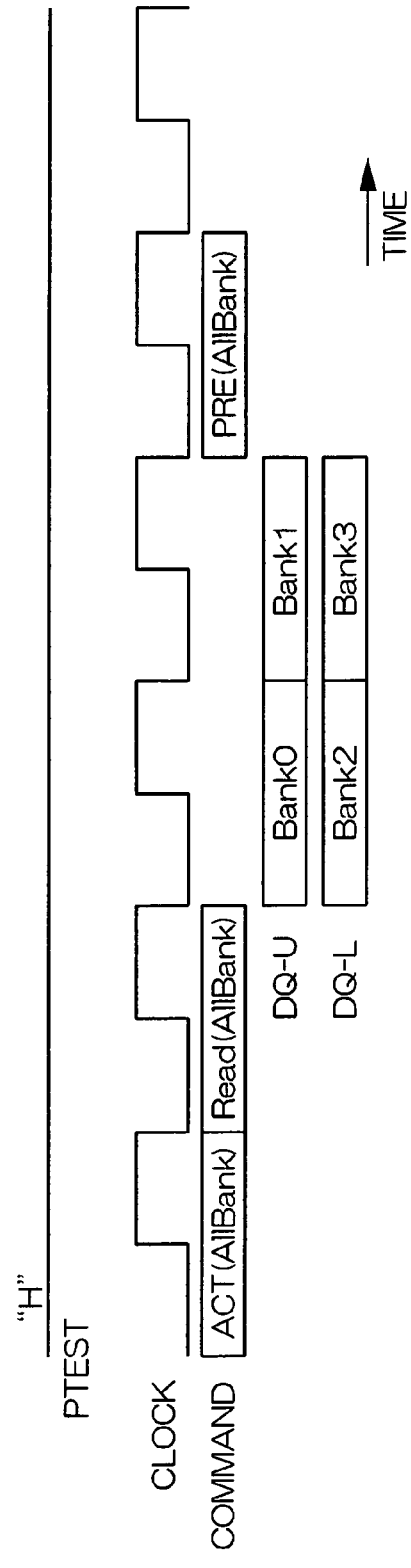
FIG. 17B is a timing chart that explains the data read operation of the parallel test mode in the configuration shown in FIG. 16, according to the fourth embodiment of the present invention.

The signal PTEST, the clock signal, the command input from the outside, the variations of the data of the output lines DQ-U and DQ-L of the comparator circuits 22 and 23 are shown, from the top to the bottom in order, in FIGS. 17A and 17B, as is the case with FIG. 12A and FIG. 12B.

As described above, according to the third embodiment of the present invention, the data writing during the parallel test can be simultaneously achieved by controlling the transistor Tr A, which divides the MIO line, to be turned off in the writing operation of the test data.

Alternately, according to the fourth embodiment of the present invention, since the test data for writing, which is input to one side of the MIO line separated by the transistor Tr A, is mutually transferred to the circuit provided at one end of the other side of the MIO line separated by the transistor Tr A by the excusive data line, the data writing during the parallel test can be simultaneously achieved.

Thereby, as is the case with the first and second embodiments, since it is unnecessary to input data in serial in the data writing during the parallel test mode with keeping the availability in the data readout during the parallel test mode, it is possible to further reduce the testing time, and hence, the testing cost can be reduced. A modification, for example, a combination of the configuration and the circuit operation according to the first to fourth embodiments of the present invention, can be add to the configuration and the circuit operation according to the third and fourth embodiments of the present invention.

According to the present invention, for example, a gate, which plays a role of the switch, is provided at the intermediate position of the main input and output (MIO) line and the like, the gate is always turned on during the normal operation mode, and the gate is turned off during the parallel test mode. Thereby, the data output line is separated on both sides of the gate. The data of each bank during the parallel test mode is read from each separated portion (for example, edge) of the data output line, the parallel test data of a plurality of the banks can be simultaneously read out. Therefore, since a data amount that can be simultaneously read out can be increased rather than the case of the serial operation, the parallel test, in which the signal of a plurality of the data output lines are compared, can be easily demonstrated in a short time in the semiconductor memory device in which the same data output line is commonly used by a plurality of the banks.

It is apparent that the present invention is not limited to the above embodiments, but may be modified and changed without departing from the scope and spirit of the invention.

Alternately, although the invention has been described above in connection with several preferred embodiments thereof, it will be appreciated by those skilled in the art in that those embodiments are provided solely for illustrating the invention, and should not be relied upon to construe the appended claims in a limiting sense.

What is claimed is:

1. A semiconductor memory device, in which a plurality of data output lines are commonly used by a plurality of banks, comprising:

a plurality of first gate circuits each of which is provided at each intermediate position of said plurality of said data output lines, and is controlled to be turned on during a normal operation mode and to be turned off at least when reading data during a parallel test mode.

2. The semiconductor memory device as recited in claim 1, wherein
said plurality of said first gate circuits are controlled to be turned on during said normal operation mode and to be turned off during said parallel test mode.

3. The semiconductor memory device as recited in claim 1, further comprising
a comparator circuit that inputs in parallel and compares signals from separated parts of said data output lines separated by said plurality of said first gate circuits when said first gate circuits are turned off.

4. The semiconductor memory device as recited in claim 1, wherein
each of said first gate circuits is provided at a position corresponding to a boundary of said plurality of said banks.

5. The semiconductor memory device as recited in claim 3, wherein:
said plurality of said first gate circuits are provided to separate said data output lines for each of said plurality of said banks; and
said comparator circuit inputs in parallel and compares said signals from said separated parts in a time division manner divided by a number corresponding to a number of said banks.

6. The semiconductor memory device as recited in claim 3, further comprising a connecting circuit that connects said separated parts of said data output lines with said comparator circuit during said parallel test mode.

7. The semiconductor memory device as recited in claim 6, wherein
said connecting circuit includes:
a second gate circuit which is controlled to be turned on during said parallel test mode; and
a data output auxiliary line which is connected with said second gate circuit, wherein line width of a circuit layout of said data output auxiliary line is narrower than that of said data output line.

8. The semiconductor memory device as recited in claim 7, wherein
said second gate circuit is controlled to be turned on when writing data during said parallel test mode.

9. The semiconductor memory device as recited in claim 3, further comprising
a data line that transfers data written in one of said separated parts of said data output lines during said parallel test mode to another of said separated parts.

10. A control method of a semiconductor memory device, in which a plurality of data output lines are commonly used by a plurality of banks, said control method comprising:
controlling a plurality of gate circuits, each of which is provided at each intermediate position of said plurality of said data output lines, to be turned on during a normal operation mode; and
controlling said plurality of said gate circuits to be turned off at least when reading data during a parallel test mode.

* * * * *